(12) United States Patent
Jung et al.

(10) Patent No.: US 7,972,883 B2
(45) Date of Patent: Jul. 5, 2011

(54) METHOD OF MANUFACTURING PHOTOELECTRIC DEVICE

(75) Inventors: Seung-Jae Jung, Seoul (KR);
Byoung-June Kim, Seoul (KR);
Jin-Seock Kim, Cheonan-si (KR);
Czang-Ho Lee, Hwaseong-si (KR);
Myung-Hun Shin, Suwon-si (KR);
Joon-Young Seo, Seoul (KR); Dong-Uk Choi, Seoul (KR); Byoung-Kyu Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/400,674

(22) Filed: Mar. 9, 2009

(65) Prior Publication Data
US 2009/0233399 A1 Sep. 17, 2009

(30) Foreign Application Priority Data

Mar. 13, 2008 (KR) .................. 10-2008-0023490

(51) Int. Cl.
*H01L 21/00* (2006.01)
(52) U.S. Cl. ............ 438/32; 438/964; 327/102
(58) Field of Classification Search ........... 438/32, 438/964; 327/50.11, 102, 50
See application file for complete search history.

(56) References Cited

U.S. PATENT DOCUMENTS

| 5,397,350 | A  | * | 3/1995  | Chow et al. ......... 623/6.63 |
| 6,200,711 | B1 | * | 3/2001  | Kurihara et al. ......... 430/5 |
| 6,624,049 | B1 | * | 9/2003  | Yamazaki ......... 438/476 |
| 2004/0246587 | A1 | * | 12/2004 | Ozawa ......... 359/618 |
| 2009/0176321 | A1 | * | 7/2009  | Park ......... 438/16 |
| 2009/0206354 | A1 | * | 8/2009  | Kitano et al. ......... 257/98 |

* cited by examiner

*Primary Examiner* — Matthew Smith
*Assistant Examiner* — John M Parker
(74) *Attorney, Agent, or Firm* — Innovation Counsel LLP

(57) ABSTRACT

In a method of manufacturing a photoelectric device, a transparent conductive layer is formed on a substrate, and the transparent conductive layer is partially etched using an etching solution including hydrofluoric acid. Thus, a transparent electrode having a concavo-convex pattern on its surface is formed. When the transparent conductive layer is partially etched, a haze of the transparent electrode may be controlled by adjusting an etching time of the transparent conductive layer. Also, since the etching solution is sprayed to the transparent conductive layer to etch the transparent conductive layer, the concavo-convex pattern on the surface of the transparent electrode may be easily formed even though the size of the substrate increases.

22 Claims, 9 Drawing Sheets

Fig. 9

| Etching time(sec) | | 0 | 30 | 40 | 50 | 60 | 70 | 80 |
|---|---|---|---|---|---|---|---|---|
| RMS Roughness (nm) | Sample 1 | 2.90 | 23.45 | 25.82 | 33.09 | 30.2 | 36.91 | 36.94 |
| | Sample 2 | 1.79 | 19.08 | 27.24 | 44.09 | 28.00 | 33.93 | 34.42 |
| | Sample 3 | 1.79 | 21.10 | 29.71 | 38.77 | 35.15 | 39.00 | 38.91 |
| | Average | 2.16 | 21.21 | 27.59 | 38.65 | 31.12 | 36.61 | 36.76 |

METHOD OF MANUFACTURING PHOTOELECTRIC DEVICE

CROSS-REFERENCE TO RELATED APPLICATION

This application claims priority to Korean Patent Application No. 2008-23490 filed on Mar. 13, 2008, the content of which is herein incorporated by reference in its entirety.

BACKGROUND

1. Field of the Invention

The present invention relates to a method of manufacturing a photoelectric device. More particularly, the present invention relates to a method of manufacturing a photoelectric device capable of easily forming an electrode that is used to improve photoelectric conversion efficiency.

2. Description of the Related Art

As a type of photoelectric device that converts light energy into electric energy, a solar battery that converts the light energy of the sun's rays into electric energy has been widely used. A solar battery has a multi-layer structure composed of two or more conductive materials. For instance, the solar battery has the structure of a p-type semiconductor and an n-type semiconductor junctioned with the p-type semiconductor or a structure of a p-type semiconductor, an n-type semiconductor and an intrinsic semiconductor disposed between the p-type semiconductor and the n-type semiconductor and junctioned with the p-type semiconductor and the n-type semiconductor. The semiconductors absorb the light energy of the sun's rays and cause a photoelectric effect to generate electrons and holes, so that the solar battery in turn generates a current using electrons and holes when a bias is applied thereto.

As a conventional method of manufacturing the solar battery, a method where a first electrode, a semiconductor layer, and a second electrode are sequentially formed on a glass substrate has been suggested. The first or the second electrode includes a transparent conductive layer in order to allow the light to be supplied to the semiconductor layer through the glass substrate and the transparent conductive layer, and the semiconductor layer causes the photoelectric conversion using the light energy.

The photoelectric conversion efficiency of the solar battery depends on a ratio of an amount of current generated by the solar battery to an amount of light applied to the solar battery. In order to improve the photoelectric conversion efficiency of the semiconductor layer, a thickness of the semiconductor layer increases, or the light passing through the transparent conductive layer is scattered to enhance the light paths in the semiconductor layer.

In order to enhance the light paths in the semiconductor layer, the transparent conductive layer on which concavo-convex portions are formed is formed on the substrate using an Atmospheric Pressure Chemical Vapor Deposition ("APCVD") method or a Low Pressure Chemical Vapor Deposition ("LPCVD") method. When forming the transparent conductive layer using the LPCVD method, the concavo-convex portions are formed by adjusting reaction gases or process conditions. In another method, the concavo-convex portions are formed by wet-etching the transparent conductive layer after forming the transparent conductive layer on the substrate by a sputtering method.

As described above, various methods have been researched in order to enhance the light paths.

SUMMARY

The present invention provides a method of manufacturing a photoelectric device capable of forming an electrode that improves a photoelectric efficiency.

In an exemplary embodiment of the present invention, a method of manufacturing a photoelectric device is provided as follows.

A first electrode is formed on a substrate, and is partially etched using an etching solution including hydrofluoric (HF) acid during a predetermined process time to form a concavo-convex pattern on a surface of the first electrode. After the concavo-convex pattern is formed on the surface of the first electrode, a semiconductor layer that causes a photoelectric conversion is formed on the first electrode using an incident light, and a second electrode is formed on the semiconductor layer.

The concavo-convex pattern formed on the first electrode scatters the light incident to the semiconductor layer through the substrate to increase light paths in the semiconductor layer, therefore enhancing the photoelectric efficiency of the semiconductor layer.

Also, the concavo-convex pattern may be formed when the etching solution is sprayed on the first electrode. Therefore, even though the size of the substrate increases, the etching solution may still be easily applied to the first electrode formed on the substrate, so that the concavo-convex pattern may be easily formed on the surface of the first electrode.

In another aspect of the present invention, a method of manufacturing a photoelectric device is provided as follows.

A first electrode is formed on a substrate, and a semiconductor layer that causes a photoelectric conversion is formed on the first electrode using an incident light. Then, a second electrode is formed on the semiconductor layer.

After the second electrode is formed on the semiconductor layer, the second electrode is partially etched using an etching solution including hydrofluoric acid during a predetermined process time to form a concavo-convex pattern on a surface of the second electrode.

According to the above, the transparent conductive layer may be formed using a sputtering method. It is easier to form the transparent layer on the substrate using the sputtering method than using a Chemical Vapor Deposition (CVD) method. In addition, a haze of the transparent electrode may be controlled by adjusting the etching time for the transparent conductive layer.

BRIEF DESCRIPTION OF THE DRAWINGS

The above and other advantages of the present invention will become readily apparent by reference to the following detailed description when considered in conjunction with the accompanying drawings wherein:

FIG. 9 is a table showing a root-mean-square value of a surface roughness of a transparent electrode of FIG. 3.

DESCRIPTION OF THE EMBODIMENTS

Figure 1:
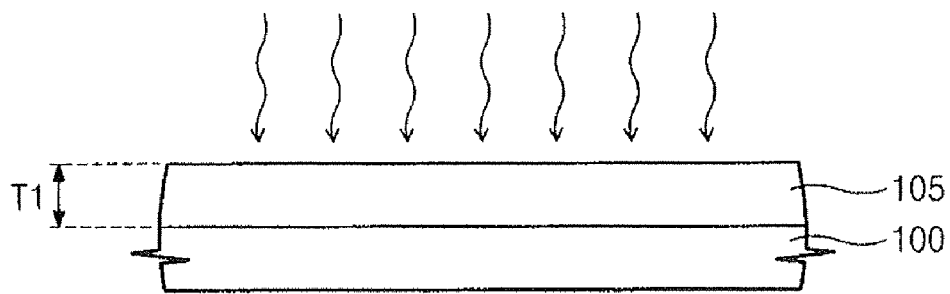
FIGS. 1 to 4 are process views showing an exemplary embodiment of a manufacturing process of a solar battery according to the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIGS. 1 to 4 are process views showing an exemplary embodiment of a manufacturing process of a solar battery according to the present invention.

Referring to FIG. 1, a transparent conductive layer 105 is formed on a substrate 100. The substrate 100 may be either a glass substrate, a quartz substrate or a metal substrate, and the transparent conductive layer 105 may have a first thickness T1 of about 10000 angstroms to about 12000 angstroms. The transparent conductive layer 105 may be formed through a sputtering process, and a material including zinc oxide (ZnO) of about 98 wt % (weight percent) and aluminum oxide ($Al_2O_3$) of about 2 wt % may be used as a target for the sputtering process. After the sputtering process is finished, the transparent conductive layer 105 including zinc oxide (ZnO) that is doped with aluminum (Al) is formed on the substrate 100.

Figure 2:
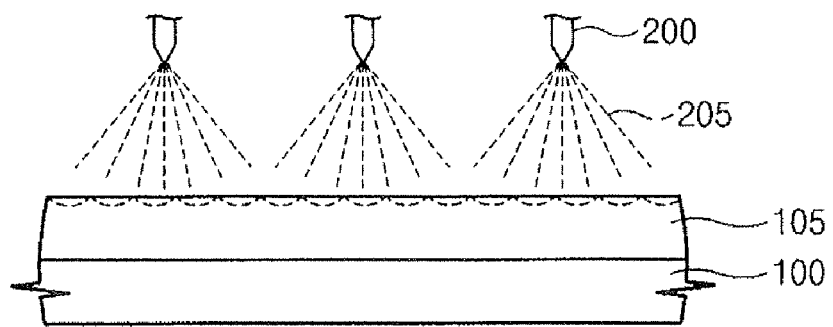
Figure 3:
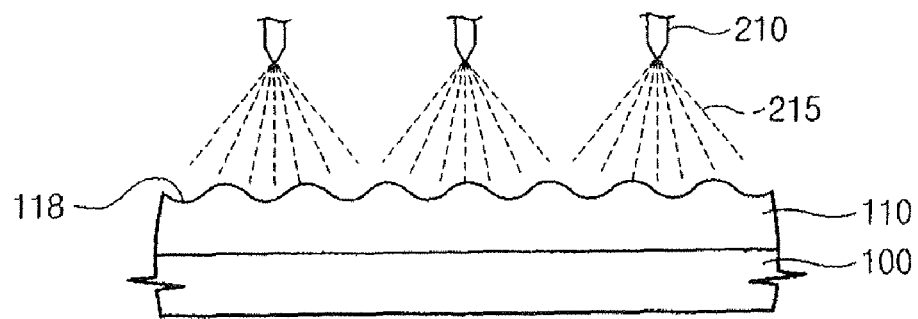

Referring to FIGS. 2 and 3, an etching solution 205 is provided to the substrate 100 on which the transparent conductive layer 105 is formed to partially etch a surface of the transparent conductive layer 105 during a predetermined etching time. Thus, the transparent conductive layer 105 is etched by etching solution 205 to form a transparent electrode 110 on which a concavo-convex pattern is formed. The etching solution 205 may include hydrofluoric (HF) acid and deionized water (DI). That is, the etching solution 205 may be a liquid including hydrofluoric (HF) acid that is diluted by deionized water (DI). A weight ratio of hydrofluoric (HF) acid to deionized water (DI) in the etching solution 205 may be in a range from about 1:10 to about 1:1000. In the present exemplary embodiment, the weight ratio of hydrofluoric (HF) acid to deionized water (DI) in the etching solution 205 is about 1:400.

The etching solution 205 is provided to the transparent conductive layer 105 by first sprayers 200. The first sprayers 200 are arranged above the transparent conductive layer 105 to uniformly supply the etching solution 205 to an entire surface of the transparent conductive layer 105. Therefore, even though the size of substrate 100 increases, the etching solution 205 may still be uniformly supplied to the transparent conductive layer 105 formed on the substrate 100 by increasing the number of first sprayers 200.

Although not shown in figures, the transparent conductive layer 105 may be etched by dipping the substrate 100 into a container that contains etching solution 205.

Referring to FIG. 3, a cleaning solution 215 is supplied to the transparent electrode 110 on which the concavo-convex pattern 118 is formed to clean the transparent electrode 110. The cleaning solution 215 may include deionized water (DI) and may be uniformly supplied to the entire surface of the transparent electrode 110 by using second sprayers 210.

Figure 4:
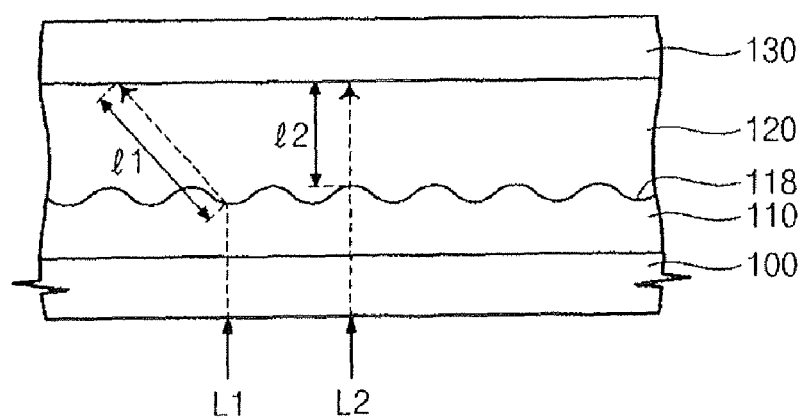

Referring to FIG. 4, a semiconductor layer 120 is formed on the transparent electrode 110, and a metal electrode 130 is formed on the semiconductor layer 120, thereby completely fabricating a solar battery 300.

The semiconductor layer 120 includes a semiconductor material such as silicon (Si), cadmium telluride (CdTe), copper indium gallium selenide (CIGS), copper indium selenide (CIS), and gallium arsenide (GaAs) and absorbs light energy to cause photoelectric conversion. The semiconductor layer 120 may have a multi-layer structure composed of a p-type semiconductor layer and an n-type semiconductor layer that are sequentially stacked, or the semiconductor layer 120 may be formed by disposing an intrinsic semiconductor layer between the p-type semiconductor layer and the n-type semiconductor layer. In case the semiconductor layer 120 includes the p-type semiconductor layer, the intrinsic semiconductor layer, and the n-type semiconductor layer, a buffer layer (not shown) may be further arranged between the p-type semiconductor layer and the intrinsic semiconductor layer in order to improve an interfacial characteristic between the p-type semiconductor layer and the intrinsic semiconductor layer.

The metal electrode 130 may include a metallic material having good electric conductivity, such as aluminum (Al), silver (Ag), copper (Cu), or platinum (Pt). The metal electrode 130 is formed on the semiconductor layer 120 and separates electrons and holes that are generated by the photoelectric conversion in the semiconductor layer 120 together with the transparent electrode 110.

As described above, the concavo-convex pattern 118 is formed on the surface of the transparent electrode 110 that is adjacent to the semiconductor layer 120. The concavo-convex pattern 118 scatters the light provided exteriorly in order to enhance light paths of the light in the semiconductor layer 120. As a result, the semiconductor layer 120 may use more light energy for the photoelectric conversion according to the enhanced light paths, therefore improving the efficiency of photoelectric conversion.

More particularly, when the light that is provided from outside the solar battery 300 and scattered by the concavo-convex pattern 118 is denoted as a first light L1, the light path of the first light L1 is changed by the concavo-convex pattern 118, and thus the light path of the first light L1 has a first length l1 in the semiconductor layer 120. On the other hand, the light that is provided from outside the solar battery 300 and has a light path that is not changed by the concavo-convex pattern 118 is denoted as a second light L2, and the light path of the second light L2 has a second length l2 in the semiconductor layer 120, which is shorter than the first length l1.

As describe above, the concavo-convex pattern 118 scatters the light that is provided to the semiconductor layer 120 from the exterior in order to enhance the light path of the light that passes through the semiconductor layer 120. As a result, the photoelectric conversion efficiency is improved when the light path is enhanced in the semiconductor layer 120 by the concavo-convex pattern 118.

Figure 5:
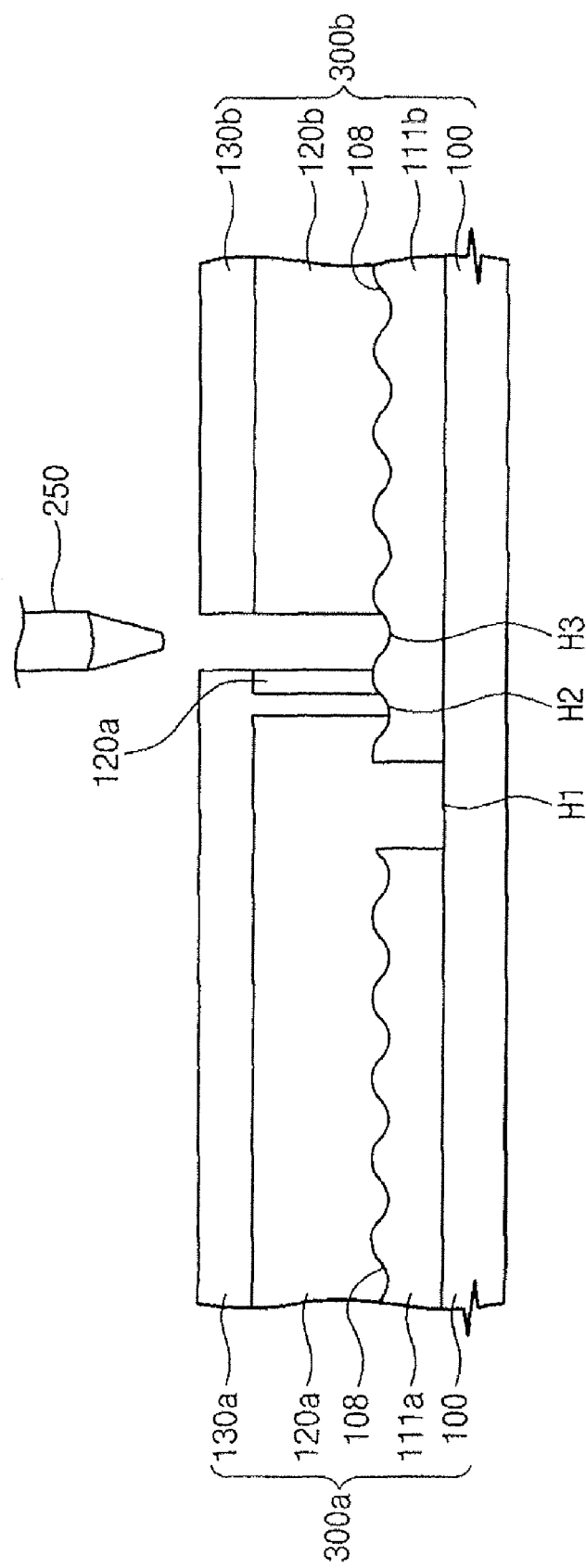
FIG. 5 is a view showing a method of forming a solar battery module including a solar battery of FIG. 4.

FIG. 5 is a view showing a method of forming a solar battery module including the solar battery of FIG. 4. More particularly, FIG. 5 shows a method that electrically connects a plurality of solar batteries formed on a substrate by employing the manufacturing method of the solar battery shown in FIGS. 1 to 4. In FIG. 5, the same reference numerals denote the same elements in FIGS. 1 to 4, and thus the detailed descriptions of the same elements will be omitted.

Referring to FIG. 5, a transparent conductive layer (not shown) is formed on a substrate 100 and the transparent conductive layer is partially etched to form a concavo-convex pattern 108. After the transparent conductive layer is formed on the substrate, the transparent conductive layer is patterned by using a laser scriber 250 to form a first transparent electrode 111a and a second transparent electrode 111b that are spaced apart from each other by a first groove H1 on the substrate 100.

After forming the first transparent electrode 111a and the second transparent electrode 111b, a semiconductor layer (not shown) that covers the first and second transparent electrodes 111a and 111b is formed. After the semiconductor layer is formed, a first semiconductor layer 120a and a second semiconductor layer 120b that are spaced apart from each other are formed by using the laser scriber 250. The first and second semiconductor layers 120a and 120b are spaced apart by a second groove H2. The second groove H2 is not aligned with the first groove H1 and partially exposes the second transparent electrode 111b.

After forming the first and second semiconductor layers 120a and 120b, a metal conductive layer (not shown) is formed to cover the first and second semiconductor layers 120a and 120b. Then, a first metal electrode 130a and a second metal electrode 130b that are spaced apart from each other by a third groove H3 are formed by using the layer scriber 250. The third groove H3 is not aligned with either the first groove H1 or the second groove H2. The third groove H3 extends through the second metal electrode 130b and the second semiconductor layer 120b but stops at the surface of the second transparent electrode 111b. As a result, a first solar battery 300a that includes the first transparent electrode 111a, the first semiconductor layer 120a, and the first metal electrode 130a is formed on the substrate 100, and also a second solar battery 300b that includes the second transparent electrode 111b, the second semiconductor layer 120b, and the second metal electrode 130b is formed on the substrate 100.

As shown in FIG. 5, the first metal electrode 130a is electrically connected to the second transparent electrode 111b through the second groove H2. Thus, the first solar battery 300a is electrically connected to the second solar battery 300b in series.

Figure 6A:
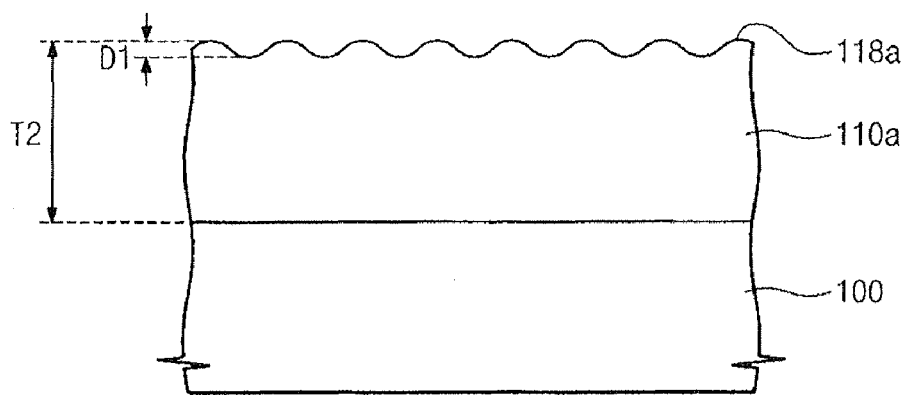
FIGS. 6A to 6C are enlarged sectional views showing a transparent electrode of FIG. 3.
Figure 6B:
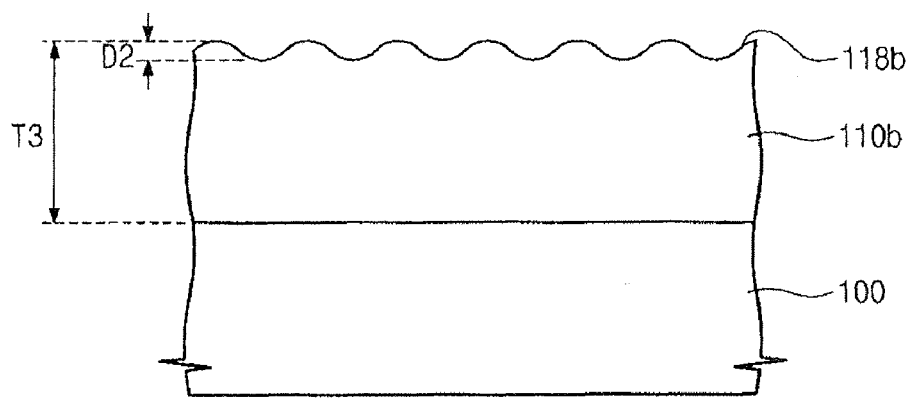
Figure 6C:
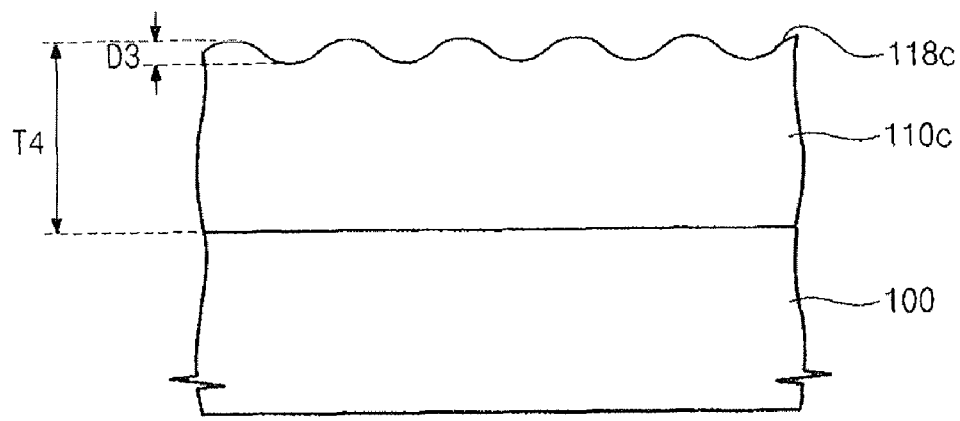

FIGS. 6A to 6C are enlarged sectional views showing the transparent electrode of FIG. 3. More particularly, FIGS. 6A, 6B, and 6C show the transparent electrode that is etched using the etching solution 205 (See FIG. 2) by 30 seconds (FIG. 6A), 60 seconds (FIG. 6B), and 80 seconds (FIG. 6C), respectively.

Referring to FIGS. 2 and 6A, when the transparent conductive layer 105, as shown in FIG. 2, is etched during 30 seconds using the etching solution 205, the transparent conductive layer 105 is partially removed by a first depth D1 to form a first preliminary transparent electrode 110a having a first preliminary concavo-convex pattern 118a, as shown in FIG. 6A. The first preliminary transparent electrode 110a that is formed by etching the transparent conductive layer 105 during 30 seconds has a second thickness T2 of about 9700 Å.

Referring to FIGS. 2 and 6B, when the transparent conductive layer 105, as shown in FIG. 2, is etched during 60 seconds using the etching solution 205, the transparent conductive layer 105 is partially removed by a second depth D2 that is greater than the first depth D1 to form a second preliminary transparent electrode 110b having a second preliminary concavo-convex pattern 118b, as shown in FIG. 6B. The second preliminary transparent electrode 110b that is formed by etching the transparent conductive layer 105 during 60 seconds has a third thickness T3 of about 8000 Å.

Referring to FIGS. 2 and 6C, when the transparent conductive layer 105, as shown in FIG. 2, is etched during 80 seconds using the etching solution 205, the transparent conductive layer 105 is partially removed by a third depth D3 that is greater than the second depth D2 to form a third preliminary transparent electrode 110c having a third preliminary concavo-convex pattern 118c, as shown in FIG. 6C. The third preliminary transparent electrode 110c that is formed by etching the transparent conductive layer 105 during 80 seconds has a fourth thickness T4 of about 7800 Å.

Consequently, as the etching time during which the transparent conductive layer 105 is etched increases, the roughness of the concavo-convex pattern formed on the surface of the transparent conductive layer 105 increases, so that the average thickness of the transparent conductive layer 105 deceases. Thus, the thickness and the roughness of the transparent electrode 110 may be controlled by adjusting the etching time of the transparent conductive layer 105.

Figure 7:
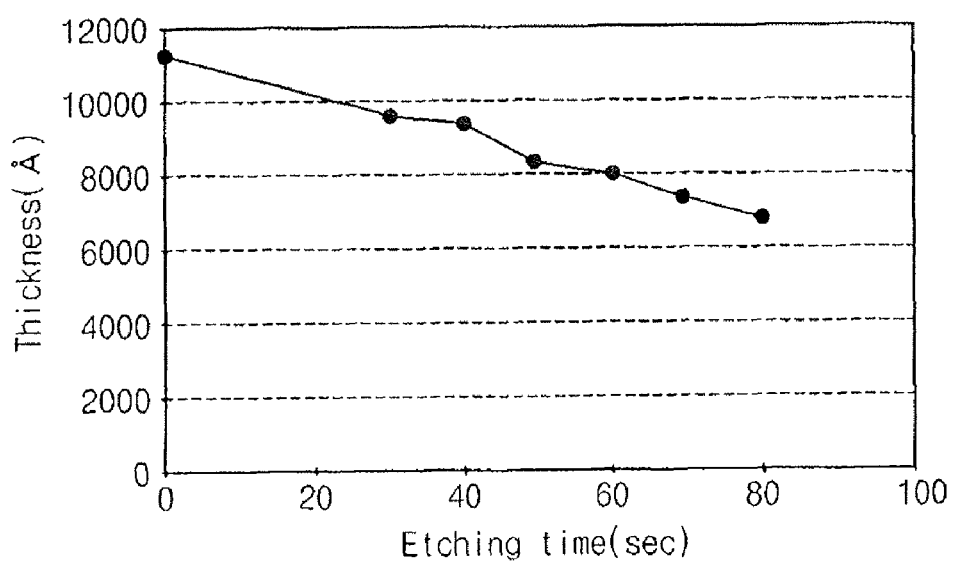
FIG. 7 is a graph showing a thickness variation of a transparent electrode of FIG. 3 as a function of etching time.

Experimental results verifying the above-described facts are illustrated in FIGS. 7 to 9. FIG. 7 is a graph showing the thickness variation of the transparent electrode of FIG. 3 as a function of the etching time.

Referring to FIG. 7, when the transparent electrode 110 (See FIG. 3) is formed by etching the transparent conductive layer 105 (See FIG. 2), the thickness (measured in Angstroms, on the y-axis) of the transparent electrode 110 decreases as the etching time (measured in seconds, on the x-axis) for the transparent conductive layer 105 increases. Thus, the transparent electrode 110 may be formed in a desired thickness by controlling the etching time.

Figure 8A:
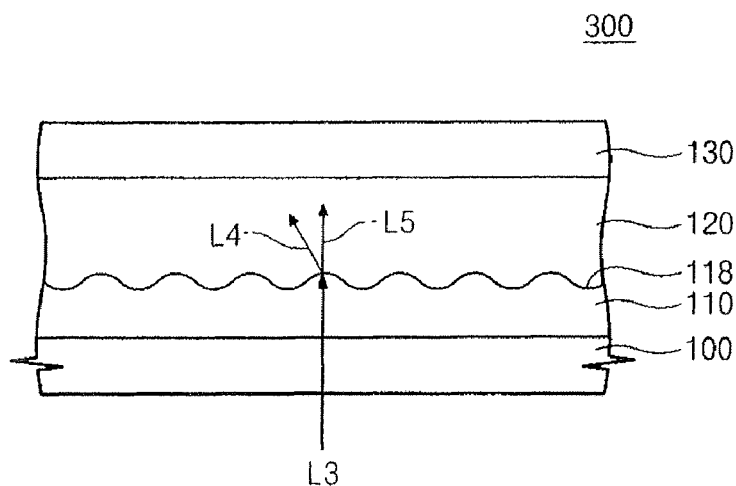
FIG. 8A is a view showing a method of measuring a haze of a solar battery according to the present invention.

FIG. 8A is a view showing a method of measuring a haze of the solar battery according to the present invention.

Referring to FIGS. 1 and 8A, the solar battery 300 includes the transparent electrode 110 that is formed on the substrate 100. After the transparent conductive layer 105 is formed on the substrate 100, the etching solution 205 (See FIG. 2) is provided to the transparent conductive layer 105 to form the concavo-convex pattern 118 on the transparent electrode 110.

In the present exemplary embodiment, the transparent conductive layer 105 is formed on the substrate 100, which has a length of about 300 mm and a width of about 400 mm, through a sputtering process. In the sputtering process, a sample including about 98 wt. % zinc oxide (ZnO) and about 2 wt. % aluminum oxide ($Al_2O_3$) is used as a target. When the sputtering process is completely performed, the transparent conductive layer 105 is formed with a thickness of about 1 micrometer on the substrate 100.

After the transparent conductive layer 105 is formed on the substrate 100, the transparent conductive layer 105 is etched during about 30 seconds to about 80 seconds using an etching solution in which hydrofluoric (HF) acid and deionized water (D1) are mixed with a weight ratio of 1:400, so that the transparent electrode 110 having the concavo-convex pattern 118 is formed. The concavo-convex pattern 118 scatters the light that passes through the transparent electrode 110 to enhance the light path in the semiconductor layer 120.

Meanwhile, a haze of the transparent electrode 110 is represented by the ratio of an amount of light that passes through the transparent electrode 110 to an amount of light that is scattered by the transparent electrode 110, and a value of the haze may be controlled according to the etching time during which the transparent conductive layer 105 is etched by the etching solution. An equation for the haze of the transparent electrode 110 is as follows:

$$TD=TT-PT \text{Haze}(\%)=(TD/TT) \times 100 \quad \text{Equation}$$

In the equation, TT represents the total amount of light that passes through a material, and TD represents the amount of light that is scattered by the material. Also, when an amount of light whose direction of propagation is not changed by the material is denoted as PT, the value of PT is obtained by subtracting the scattered light amount TD from the total light amount TT.

In FIG. 8A, TT represents the light amount of a third light L3, TD represents the light amount of a fourth light L4, and PT represents the light amount of a fifth light L5.

Figure 8B:
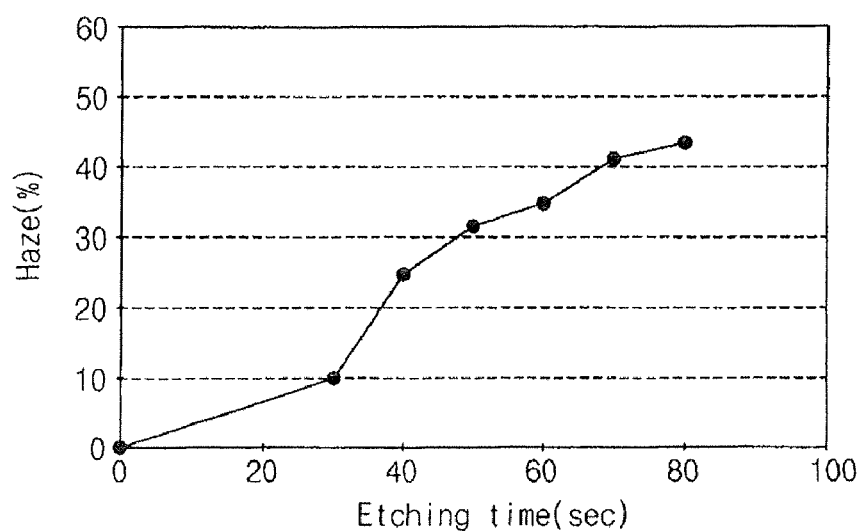
FIG. 8B is a graph showing a haze of a transparent electrode of FIG. 8A as a function of etching time.

FIG. 8B is a graph showing the haze (measured as a percentage, on the y-axis) of the transparent electrode of FIG. 8A as a function of etching time (measured in seconds, on the x-axis).

Referring to FIGS. 1 and 8B, when the transparent electrode 110 is formed by etching the transparent conductive layer 105, the haze of the transparent electrode 110 (See FIG. 3) increases as the etching time of the transparent conductive layer 105 (See FIG. 2) increases. That is, the haze of the transparent electrode 110 may be controlled by adjusting the etching time.

Therefore, the increase of the haze according to the increase of the etching time of the transparent conductive layer 105 represents the fact that the light amount of the light scattered by transparent electrode 110 increases. As a result, the value of the haze may be in a desired range, for example, from 10% to 40%, by adjusting the etching time.

FIG. 9 is a table showing a root-mean-square value of a surface roughness of the transparent electrode of FIG. 3 that is measured using atomic force microscopy according to etching time. Calculation of a root-mean-square value for surface roughness is well known.

Referring to FIG. 9, when the transparent electrode 110 (See FIG. 3) is formed by etching the transparent conductive layer 105 (See FIG. 2), various values of surface roughness may be obtained according to the etching time of the transparent conductive layer 105. In case the etching time is within a range from 0 seconds to 50 seconds, the root-mean-square value of the surface roughness increases. However, when the etching time is within a range from 50 seconds to 80 seconds, the root-mean-square value of the surface roughness does not increase and the root mean square value of the surface roughness is maintained in a range of about 30 nm to about 35 nm. Therefore, when the etching time is controlled, the root-mean-square value of the surface roughness of the transparent electrode 110 may be maintained at about 35 nm or less.

FIGS. 10 to 13 are process views showing another exemplary embodiment of a manufacturing process of a solar battery according to the present invention. In FIGS. 10 to 13, the same reference numerals denote the same elements in previous figures, and thus the detailed descriptions of the same elements will be omitted.

Figure 10:
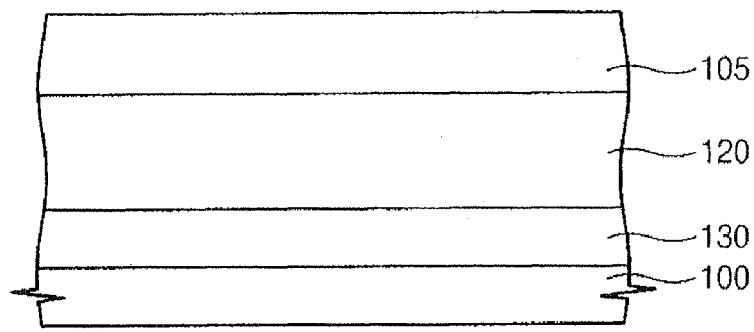
FIGS. 10 to 13 are process views showing another exemplary embodiment of a manufacturing process of a solar battery according to the present invention.

Referring to FIG. 10, a metal electrode 130 is formed on a substrate 100, and a semiconductor layer 120 and a transparent conductive layer 105 are sequentially formed on the metal electrode 130.

As in the present exemplary embodiment, in case the transparent conductive layer 105 is formed on the semiconductor layer 120, the semiconductor layer 120 causes a photoelectric conversion using the light energy of light that is incident to the transparent conductive layer 105.

Figure 11:
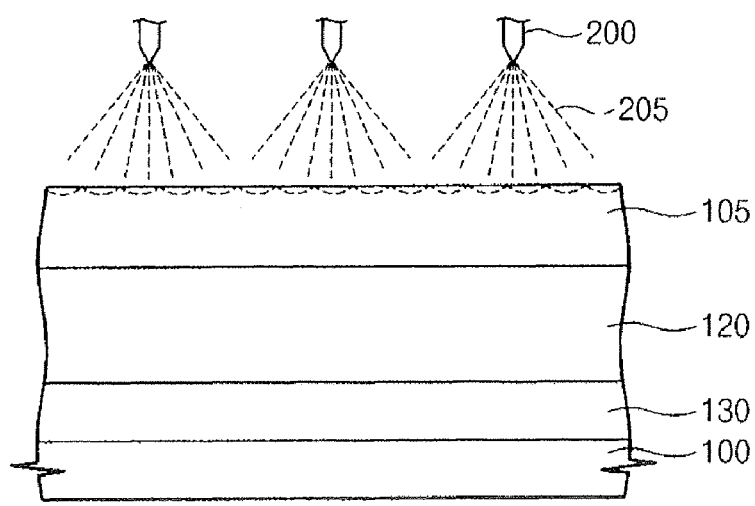
Figure 12:
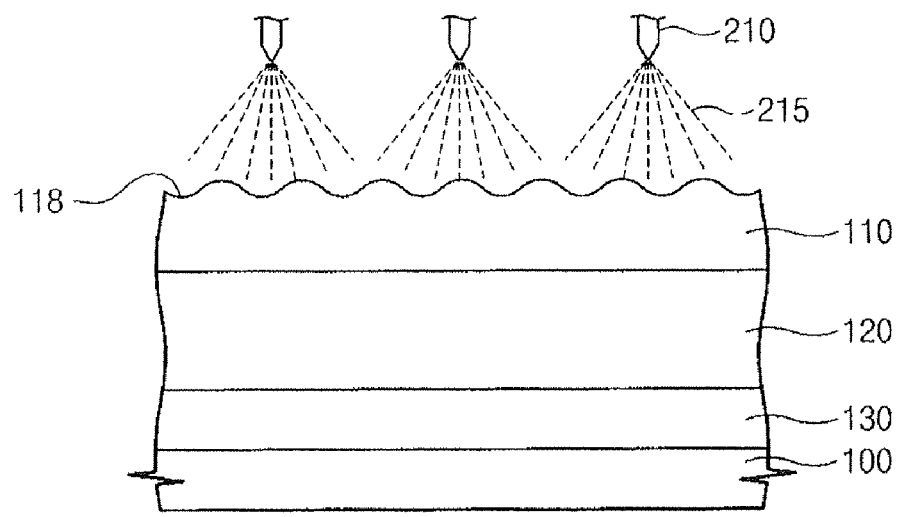
Figure 13:
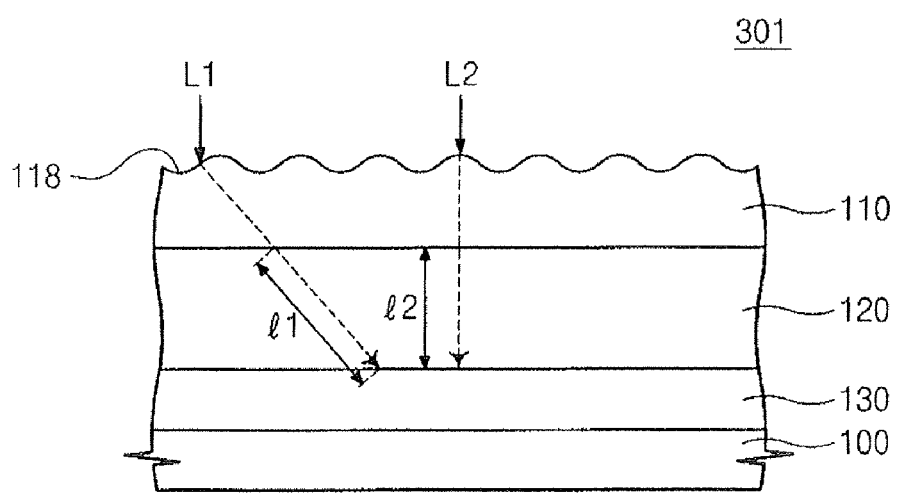

Referring to FIGS. 11 and 12, after the transparent conductive layer 105 is formed on the semiconductor layer 120, an etching solution 205 is provided to the transparent conductive layer 105 using first sprayers 200 to etch a surface of the transparent conductive layer 105 during a predetermined etching time. Therefore, a transparent electrode 110 has a concavo-convex pattern 118 formed on its surface.

After the transparent electrode 110 is formed, cleaning solution 215 is provided to the transparent electrode 110 using second sprayers 210 to clean the transparent electrode 110. Thus, a solar battery 301 including the substrate 100, the metal electrode 130, the semiconductor layer 120, and the transparent electrode 110 may be completely fabricated.

The concavo-convex pattern 118 formed on the surface of the transparent electrode 110 changes a light path of the light that passes through the transparent electrode 110 and proceeds to the semiconductor layer 120. More particularly, when light that is provided from outside the battery and scattered by the concavo-convex pattern 118 is denoted as a first light L1, the light path of the first light L1 is changed by the concavo-convex pattern 118, so that the light path of the first light L1 has a first length l1 in the semiconductor layer 120. On the other hand, when light that is provided from outside the battery does not change its light path at the concavo-convex pattern 118, this light is denoted as a second light L2, and the light path of the second light L2 has a second length 12 that is shorter than the first length 11.

As described above, the concavo-convex pattern 118 scatters the light that is provided to the semiconductor layer 120 from the exterior and enhances the distribution of the light that passes through the semiconductor layer 120. As a result, the photoelectric conversion efficiency is improved when the light distribution is enhanced in the semiconductor layer 120 by the concavo-convex pattern 118

According to the above, the transparent conductive layer is formed on the substrate, and then the transparent conductive layer is etched using the etching solution during a predetermined process time in order to form the concavo-convex pattern on the surface of the transparent electrode. In this case, the transparent conductive layer may be formed using a sputtering method. Accordingly, it is easier to form the transparent layer on the substrate using the sputtering method than by using a chemical vapor deposition (CVD) method.

More particularly, in case that the transparent conductive layer is formed using the CVD method, it is not easy to control the texture of the transparent conductive layer because the process temperature is not uniformly maintained. However, in case that the transparent conductive layer is formed on the substrate using the sputtering method and is etched by a wet-etching method, it is easy to form the transparent electrode having a concavo-convex portion thereon on a large-sized substrate. Also, the haze of the transparent electrode may be easily controlled by adjusting the wet-etching time.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a photoelectric device, comprising:
   forming a first electrode on a substrate;
   partially etching the first electrode using an etching solution including hydrofluoric (HF) acid during a predetermined process time to form a concavo-convex pattern on a surface of the first electrode;
   forming a semiconductor layer on the first electrode, the semiconductor layer causing a photoelectric conversion using an incident light; and
   forming a second electrode on the semiconductor layer.

2. The method of claim 1, wherein the etching solution is provided to the first electrode by a spraying method.

3. The method of claim 1, wherein the first electrode is formed by a sputtering method.

4. The method of claim 1, wherein the etching solution further comprises deionized water, and a weight ratio of the hydrofluoric acid to the deionized water in the etching solution is in a range of about 1:10 to 1:1000.

5. The method of claim 4, further comprising cleaning the first electrode using a cleaning solution after forming the concavo-convex pattern on the surface of the first electrode.

6. The method of claim 1, wherein the first electrode has a haze of about 5% to about 60% and the haze is controlled by adjusting the predetermined process time.

7. The method of claim 1, wherein a square average value of a surface roughness of the first electrode is in a range of about 10 nm to about 200 nm and the square average value is controlled by adjusting the predetermined process time.

8. The method of claim 1, wherein the semiconductor layer comprises silicon, cadmium telluride (CdTe), copper indium gallium selenide (CIGS), copper indium selenide (CIS), or gallium arsenide.

9. The method of claim 1, wherein the forming a second electrode on the semiconductor layer comprises forming a concavo-convex pattern on a surface of the second electrode.

10. The method of claim 9, wherein the forming the concavo-convex pattern on the surface of the second electrode comprises partially etching the second electrode using an etching solution including hydrofluoric(HF) acid.

11. The method of claim 1, wherein the first electrode comprises a zinc oxide.

12. The method of claim 11, wherein the first electrode comprises zinc oxide (ZnO) of 80 weight-percent, and the zinc oxide is doped with aluminum or gallium.

13. A method of manufacturing a photoelectric device, comprising:
   forming a first electrode on a substrate;
   forming a semiconductor layer on the first electrode, the semiconductor layer causing a photoelectric conversion using an incident light;
   forming a second electrode on the semiconductor layer; and
   partially etching the second electrode using an etching solution including hydrofluoric (HF) acid during a predetermined process time to form a concavo-convex pattern on a surface of the second electrode.

14. The method of claim 13, wherein the etching solution is provided to the second electrode by a spraying method.

15. The method of claim 13, wherein the second electrode is formed by a sputtering method.

16. The method of claim 13, wherein the etching solution further comprises deionized water, and a weight ratio of the hydrofluoric acid to the deionized water in the etching solution is in a range of 1:10 to 1:1000.

17. The method of claim 16, further comprising:
   cleaning the first electrode using a cleaning solution after forming the concavo-convex pattern on the surface of the second electrode.

18. The method of claim 13, wherein the second electrode has a haze of about 5% to about 60% and the haze is controlled by adjusting the predetermined process time.

19. The method of claim 13, wherein a square average value of a surface roughness of the second electrode is in a range of about 10 nm to about 200 nm and the square average value is controlled by adjusting the predetermined process time.

20. The method of claim 13, wherein the semiconductor layer comprises silicon, cadmium telluride (CdTe), copper indium gallium selenide (CIGS), copper indium selenide (CIS), or gallium arsenide.

21. The method of claim 13, wherein the second electrode comprises a zinc oxide.

22. The method of claim 21, wherein the second electrode comprises zinc oxide (ZnO) of 80 weight-percent, and the zinc oxide is doped with aluminum or gallium.

* * * * *